US008436660B2

(12) United States Patent
Boecker

(10) Patent No.: US 8,436,660 B2
(45) Date of Patent: May 7, 2013

(54) VOLTAGE-MODE DRIVER WITH EQUALIZATION

(75) Inventor: Charles W. Boecker, Ames, IA (US)

(73) Assignee: MoSys, Inc., Santa Clara, CA (US)

( * ) Notice: Subject to any disclaimer, the term of this patent is extended or adjusted under 35 U.S.C. 154(b) by 236 days.

(21) Appl. No.: 12/870,549

(22) Filed: Aug. 27, 2010

(65) Prior Publication Data

US 2012/0054704 A1 Mar. 1, 2012

(51) Int. Cl.
*H03K 3/00* (2006.01)
(52) U.S. Cl.
USPC .......................................................... 327/108
(58) Field of Classification Search ........................ None
See application file for complete search history.

(56) References Cited

U.S. PATENT DOCUMENTS

| | | | | |
|---|---|---|---|---|
| 6,396,329 B1 * | 5/2002 | Zerbe | ............................ | 327/336 |
| 6,624,670 B2 * | 9/2003 | Payne et al. | .................... | 327/108 |
| 6,867,618 B2 * | 3/2005 | Li et al. | ............................ | 326/83 |
| 7,737,747 B2 | 6/2010 | Kamath | | |
| 8,149,023 B2 * | 4/2012 | Rajagopalan et al. | ........ | 327/108 |
| 8,149,043 B2 * | 4/2012 | Kimura et al. | ................ | 327/427 |

OTHER PUBLICATIONS

Song, Heesoo, et al., "A Reduced-Swing Voltage-Mode Driver for Low-Power Multi-Gb/s Transmitters" , Journal of Semiconductor Technology and Science, Jun. 2009, pp. 104-109, vol. 9, No. 2, Seoul Nation University, San 56-1, School of Electrical Engineering.

* cited by examiner

*Primary Examiner* — Lincoln Donovan
*Assistant Examiner* — Khareem E Almo
(74) *Attorney, Agent, or Firm* — Toler Law Group, PC

(57) ABSTRACT

A voltage-mode differential driver may include a first nominal path that selectively couples a first supply or a second supply to a first output terminal in response to an input data. The voltage-mode differential driver may further include a first capacitive boost path that selectively couples the first supply or the second supply to the first output terminal responsive to the input data. The first capacitive boost path may be selectively enabled to provide a boost current to be added to a current from the first nominal path resulting in an output current to be provided to the first output terminal.

21 Claims, 4 Drawing Sheets

VOLTAGE-MODE DRIVER WITH EQUALIZATION

FIELD

The present disclosure relates generally to differential signal drivers.

BACKGROUND

Electronic devices often incorporate several semiconductor devices that communicate with one another over channels. High-speed operation is often a design parameter of such devices, requiring the bandwidth of the channels to be used efficiently. Current-mode drivers and voltage-mode drivers are often incorporated into transceivers to facilitate high-speed communications. Current-mode drivers and voltage-mode drivers may drive differential signals across the channel, but such drivers can consume considerable power.

Current-mode drivers utilize one or more current sources. Current-mode drivers may be undesirable in various applications because the current sources used in such drivers consume power to drive the outputs. Further, terminations at both the driver and a receiver are generally used for impedance matching, which decreases the equivalent resistance seen by the driver's output and thereby increases current consumption.

As an alternative, voltage-mode drivers may be used to drive signals. In contrast to current-mode drivers, voltage mode drivers consume less current for a particular voltage swing. However, these drivers typically use an additional voltage supply, because the output voltage swing of the driver is constrained by the supply voltage. In addition, implementation of the additional voltage supply may involve use of a large capacitor or a voltage regulator that may be difficult to incorporate onto a semiconductor die using standard fabrication procedures. Also, selective equalization of a signal to be transmitted, i.e., using a limited amount of power to drive the signal, can be difficult to implement using voltage-mode drivers.

SUMMARY

A voltage-mode differential driver operable to selectively equalize a signal to be transmitted over a channel is disclosed. The selective equalization of the signal may be achieved by boosting the power of the signal to be transmitted when the signal undergoes a bit transition. A nominal path of the driver may be connected to a supply voltage and to an output terminal of the driver and may produce a nominal path current that drives the signal to be transmitted. In response to a bit transition (e.g., 0 to 1 or 1 to 0) in the signal, a boost current from a capacitive boost path of the driver may be added to the nominal path current. The boost path current may "pull down" (e.g., when transitioning from a 1 to a 0) or "pull up" (e.g., when transitioning from a 0 to a 1) the signal to be transmitted, thereby resulting in shorter transition times and reduced power loss during the bit transition. Power levels of bits in the signal to be transmitted may thus be equalized such that each bit receives an appropriate amount of power. The disclosed voltage-mode differential driver may provide high speed data transmission with low power consumption and efficient use of channel bandwidth.

In a particular embodiment, a voltage-mode differential driver may include a first nominal path selectively coupling, responsive to input data, a first supply or a second supply to a first output terminal. The voltage-mode differential driver may further include a first capacitive boost path selectively coupling, responsive to the input data, the first supply or the second supply to the first output terminal. The first capacitive boost path may be selectively enabled to provide a boost current to be added to a current from the first nominal path, resulting in an output current to be provided to the first output terminal.

In a particular embodiment, a method may include charging a first capacitor of a capacitive boost path via a first voltage supply. The method may further include transmitting a signal at an output of a voltage-mode differential driver based on a nominal current provided by a nominal path coupled to the first voltage supply and based on a boost current from the capacitive boost path. The boost current is selectively added to the nominal current to equalize the signal.

In a particular embodiment, a transmit line driver may include a differential input, a differential output, a first supply node, and a second supply node. A first plurality of nominal paths may be coupled to the first supply node, and a second plurality of nominal paths may be coupled to the second supply node. The transmit line driver may further include a first plurality of capacitive boost paths coupled to the first supply node and a second plurality of capacitive boost paths coupled to the second supply node.

DETAILED DESCRIPTION

Figure 1:
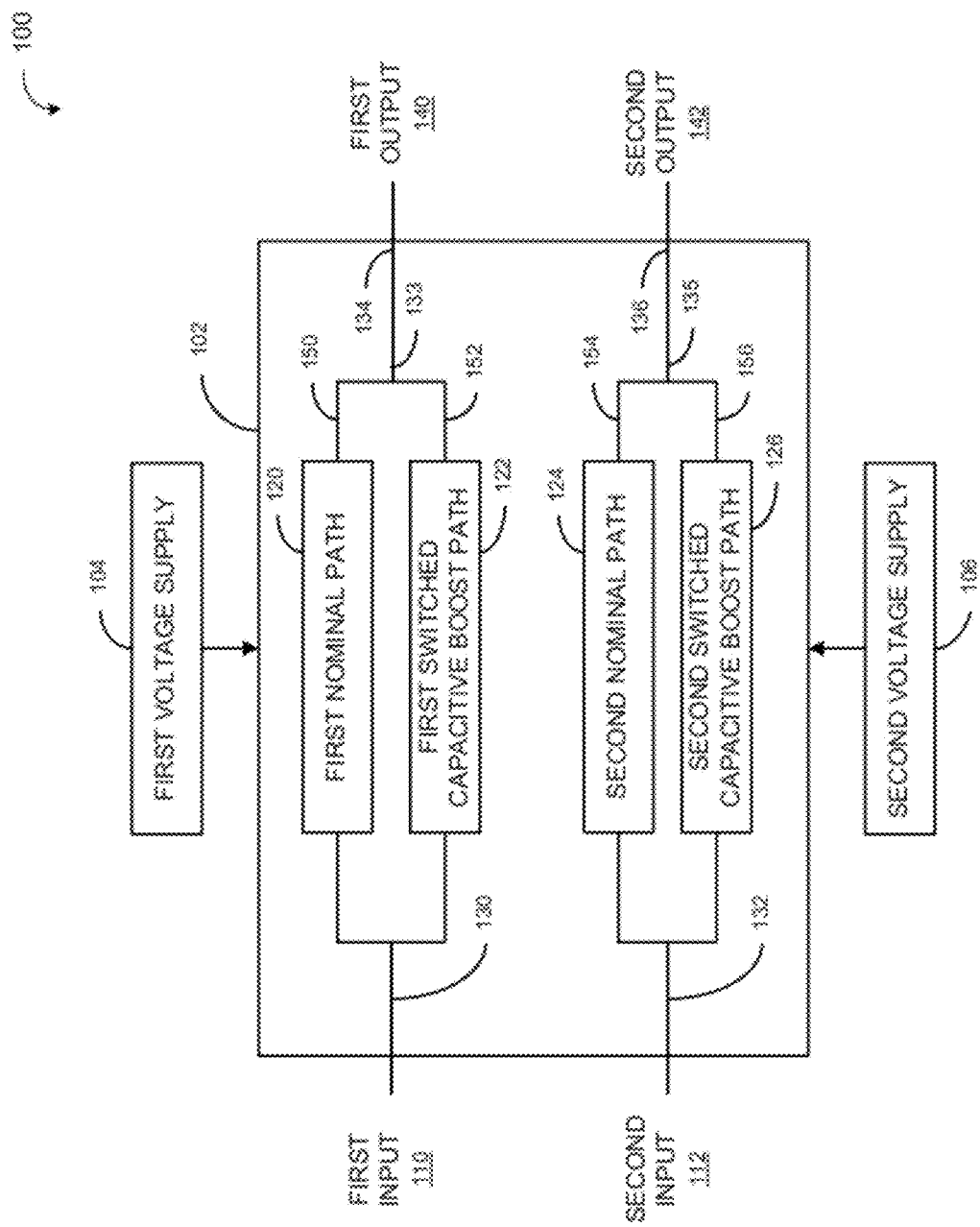
FIG. 1 is a block diagram illustrating a particular embodiment of a voltage-mode differential signal driver.

Referring to FIG. 1, a particular illustrative embodiment of a voltage-mode differential signal driver 100 is shown. The voltage-mode differential signal driver 100 includes a first nominal path 120, a first switched capacitive boost path 122, a second nominal path 124, and a second switched capacitive boost path 126. The voltage-mode differential signal driver 100 includes differential driver circuitry 102 having a representative first input 110, a representative second input 112, a first output terminal 134, and a second output terminal 136. The first output terminal 134 provides a first output 140 and the second output terminal 136 provides a second output 142. The first input 110 is received at a first input terminal 130 and the second input 112 is received at a second input terminal 132. Each of the first nominal path 120 and the first switched capacitive boost path 122 is responsive to the first input terminal 130 and is also selectively supplied by a first voltage supply 104 or a second voltage supply 106. The second nominal path 124 and the second switched capacitive boost path 126 are each responsive to the second input 112 provided at the second input terminal 132 and are coupled to and selectively supplied by the first voltage supply 104 or the second voltage supply 106.

The first nominal path 120 provides a first nominal path current 150 and the first switched capacitive boost path 122 selectively provides a first boost current 152. The first nominal path current 150 and the first boost current 152 are combined or otherwise added to provide a combined first signal 133 that may be transmitted at the first output terminal 134 as the first output 140. Similarly, the second nominal path 124 provides a second nominal path current 154 and a second switched capacitive boost path 126 selectively provides a second boost current 156. The second nominal path current 154 is combined with the second boost current 156 to provide a second combined signal 135 at the second output terminal 136 as the second output 142.

In a particular illustrative embodiment, the first switched capacitive boost path 122 includes at least a first switching element configured to selectively enable the first boost current 152 to flow between the first voltage supply 104 and the first output terminal 134 to send a first bit (e.g. a logical one bit). The first switched capacitive boost path 122 may include at least a second switching element to selectively couple the second voltage supply 106 to the first output terminal 134 via the first switched capacitive boost path 122 to send a second bit (e.g. a logical zero bit).

The voltage-mode differential signal driver 100 further includes the second nominal path 124 to drive the second output terminal 136 by coupling the second output terminal 136 to the second voltage supply 106. In addition, the voltage-mode differential signal driver circuitry 100 includes the second switched capacitive boost path 126 that includes at least a third switching element configured to selectively enable the second boost current 156 to flow between the second voltage supply 106 and the second output terminal 136 to send a first bit (e.g. the logical one bit). The second switched capacitive boost path 126 may include at least a fourth switching element to selectively couple the first voltage supply 104 to the second output terminal 136 via the second switched capacitive boost path 126 to send a second bit (e.g. the logical zero bit). The voltage-mode differential signal driver 100 may further include equalization circuitry such as control elements that are configured to selectively adjust a power of a signal to be transmitted at either the first output terminal 134, the second output terminal 136, or both.

In a particular illustrative embodiment, each of the switched capacitive boost paths 122 and 126 includes a capacitor element. In addition, each of the switched capacitive boost paths 122, 126 may further include a resistor such that the resistor and the capacitor form a resistor-capacitor (RC) element. In this case, a time constant associated with the resistive and capacitive element may be based on a loss property of a load driven by an output terminal. For example, a load may be applied or driven by the first output 140, the second output 142, or both. An insertion loss associated with the load may be measured, and the time constant associated with the RC element may be configured accordingly, e.g., with a high time constant associated with a high-loss load. The first output 140 may be communicated to a second device, such as a remote device, via a common electrical interface (CEI), such as CEI-11G-SR. The communication may occur over an attenuated or low-impedance channel The first boost current 152 provided by the switched capacitive boost path 122 is selectively provided and added to the first nominal current path 150. For example, the first boost current 152 may be provided selectively by switching a charge from a capacitor in the first switched capacitive boost path 122 in response to a signal or a bit transition of a signal received at the input terminal 130. The first switched capacitive boost path 122 thus generates the first boost current 152 to be added to the first nominal path current 150 to generate the combined first signal 133 to be provided to the output terminal 134. Thus, the first switched capacitive boost path 122 may be selectively activated to provide extra boost current during data bit transitions.

It will be appreciated that the voltage-mode differential signal driver 100 of FIG. 1 may equalize power levels between bits of a signal to be transmitted. For example, the switched capacitive boost paths 122 or 126 may provide a boost current 152 or 156 to boost a power level associated with a bit of the signal to be transmitted. The equalized bit may feature a faster transition time, i.e., a voltage or current associated with the equalized bit may be pulled up or pulled down faster. An improved transition time may facilitate higher speed communications between various devices.

Figure 2:
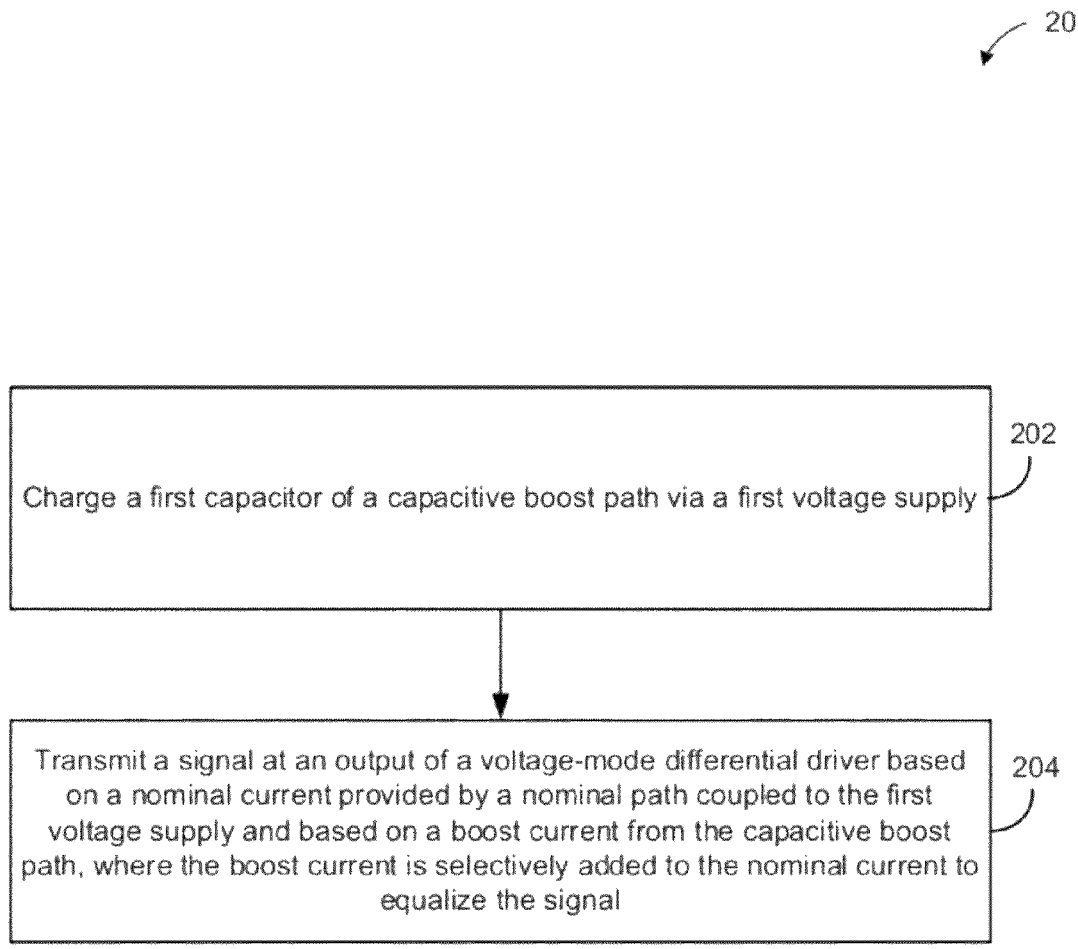
FIG. 2 is a flow diagram depicting a particular embodiment of a method of operating a voltage-mode differential signal driver.

Referring to FIG. 2, a particular illustrative embodiment of a method 200 of operating a voltage-mode differential signal driver is shown. In an illustrative embodiment, the method 200 may be performed by the voltage-mode differential signal driver 100 of FIG. 1.

The method 200 includes charging a first capacitor of a capacitive boost path via a first voltage supply, at 202, and transmitting a signal at an output of a voltage-mode differential driver based on a nominal current provided by a nominal path coupled to the first voltage supply, at 204. The signal that is transmitted is based on a boost current from the capacitive boost path. The boost current is added to the nominal current to equalize the signal to be transmitted.

In a particular illustrative embodiment, the capacitive boost path selectively generates the boost current to be added to the nominal current in response to a bit transition of an input signal received at an input terminal of the voltage-mode differential driver. For example, referring to FIG. 1, the first switched capacitive boost path 122 is responsive to the first input 110 and may be selectively activated to generate the first boost current 152 that is added to the first nominal path current 150 in response to a bit transition at the first input 110. As a further example, a first capacitor in the first switched capacitive boost path 122 may be configured to charge and selectively discharge to generate the first boost current 152 to be added to the first nominal path current 150 to generate the combined first signal 133.

It will be appreciated that the method 200 of FIG. 2 may be applicable to a wide variety of methods of communicating data. For example, the method 200 may be implemented in circuits in communication with one another, e.g., transceivers. Alternatively or in addition, a single circuit may implement the method 200 to communicate data elsewhere on the circuit, e.g. between voltage islands or voltage divisions of the circuit. A circuit operating according to the method 200 of FIG. 2 may therefore be applied to a wide variety of electrical communications applications. Further, such a circuit may facilitate higher data rate communications at a low power level.

Figure 3:
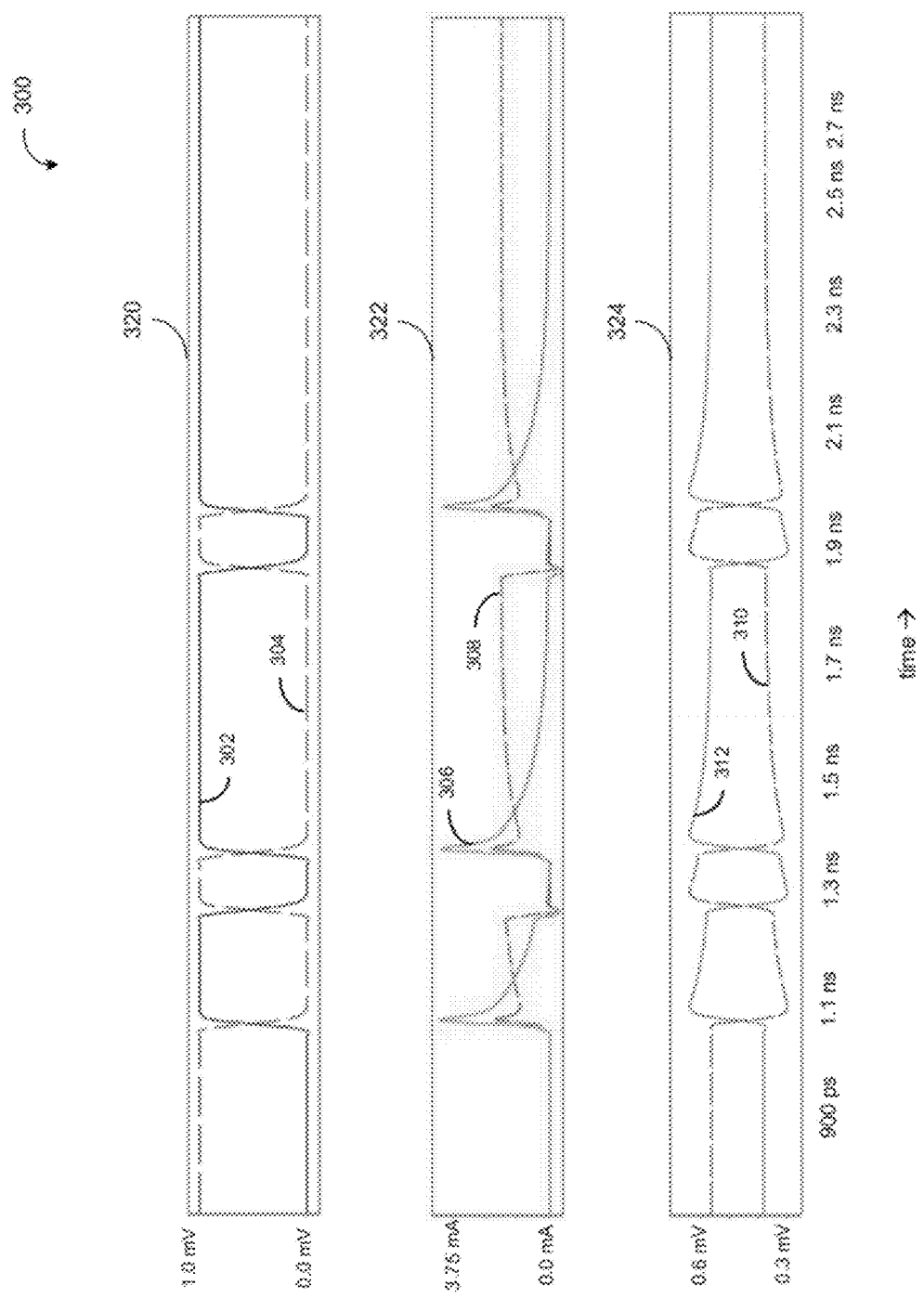
FIG. 3 is timing diagram illustrating an operation of a voltage-mode differential signal driver.

Referring to FIG. 3, timing diagrams 300 corresponding to an operation of a voltage-mode differential signal driver as described herein are illustrated. For example, a first timing diagram 320 illustrates timing of input voltages 302, 304 at the voltage-mode differential signal driver. A second timing diagram 322 illustrates a capacitive boost path current 306 and a nominal path current 308 of the voltage-mode differential signal driver. The third timing diagram 324 illustrates output voltages 310, 312 at the voltage-mode differential signal driver after application of the nominal path current and the boost path current.

Referring to the first timing diagram 320, the input voltages 302, 304 that may be received at the voltage-mode differential signal driver are shown. For example, the input voltages 302, 304 may be applied at the first and second inputs 110, 112 of FIG. 1. The input voltages 302, 304 may represent input data such as a logic low level or a logic high level. For example, when a first input voltage 302 is high or is transitioning to a high state, the second input voltage 304 is low or is transitioning to a low state, and vice versa, as depicted in the first timing diagram 320.

Referring to the second timing diagram 322, the boost path current 306 of a capacitive boost path and a nominal path current 308 of a nominal path of the voltage-mode differential driver are shown. As an example, the nominal path current 308 may be provided by the first nominal path 120 of FIG. 1 and the boost path current 306 may be provided by the first switched capacitive boost path 122 as depicted in FIG. 1. In the second timing diagram 322, the boost current 306 supplements the nominal path current 308 in response to a bit transition of the inputs 302, 304. In particular, the second timing diagram 322 shows that the boost current 306 adds current to the nominal path current 308 in response to the input 302 changing state from low to high, which may facilitate a faster pull-up time associated with the output voltage 312. Similarly, during a high-to-low transition of the input 302, the boost current 306 transitions to a low state (e.g. about 0.0 mA) to absorb power and thereby pull down the output voltage 312.

As will be appreciated, a second nominal path current of a second nominal path and a second boost path current of a second capacitive boost path may be provided. The second nominal path current and the second boost path current may be applied to yield the output voltage 310. In a particular embodiment, the second boost path current pulls down the output voltage 310 when the output voltage 312 is pulled up, and the second boost path current pulls up the output voltage 310 when the output voltage 312 is pulled down. Accordingly, the timing diagrams of FIG. 3 represent operation of circuitry that implements a voltage-mode differential signal driver.

Referring to the third timing diagram 324, resulting output voltages 310, 312 of the voltage-mode differential signal driver are shown. In particular, the output voltages 310, 312 form a differential output and correspond to the timing of the data of the input voltage as shown. Application of the nominal path current 308 and the boost current 306 may provide equalization and change the shape of the differential output signal for improved signal transmission and detection. In addition, by using a capacitive boost path to generate the boost current 308, significant power may be saved as compared to resistive techniques for equalization, such as resistor dividers.

It will be appreciated that various techniques and components may be employed to operate a voltage-mode differential driver according to the timing diagrams 300 of FIG. 3. For example, various capacitances in the circuit may be of different sizes or values to accommodate various input signal values, various characteristics of the circuit, and various impedance and capacitance characteristics of a channel over which a signal is to be transmitted. For example, capacitive devices other than capacitors (e.g., capacitive transistors) may be employed. Accordingly, a voltage-mode differential driver operating according to the timing diagrams 300 of FIG. 3 may efficiently utilize various design parameters, such as the nature of input signals and characteristics of a channel over which a signal is to be transmitted.

Figure 4:
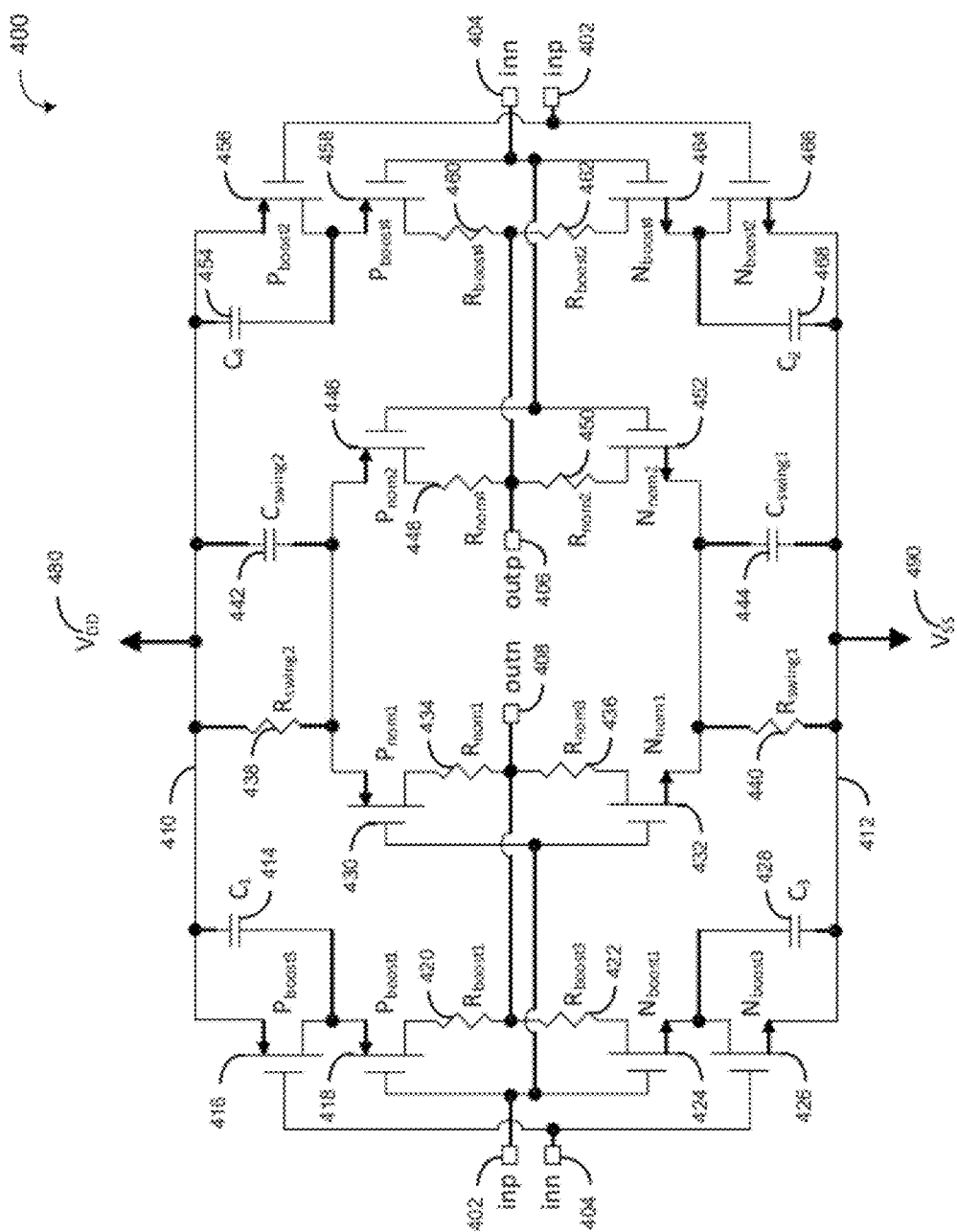
FIG. 4 is a circuit diagram of another particular embodiment of a transmit line driver.

In a particular illustrative embodiment, a voltage-mode differential signal driver may be implemented using a transmit line driver 400 as shown in FIG. 4. The transmit line driver 400 includes differential inputs 402, 404, differential outputs 406, 408, a first voltage supply node 410, and a second voltage supply node 412. A first supply voltage 480 may be applied to the first supply node 410, e.g., $V_{DD}$ as shown in FIG. 4. Similarly, a second supply voltage 490 may be applied to the second supply node 412, e.g., $V_{SS}$ as shown in FIG. 4.

According to one illustrative embodiment, the first supply voltage 480 is maintained at a first potential and the second supply voltage 490 is maintained at a second potential. In a particular embodiment, the first potential is higher than the second potential. For example, the first potential may be about one volt and the second potential may be about zero volts or ground.

The transmit line driver 400 includes a plurality of nominal paths coupled to the first supply node 410. For example, a first nominal path coupled to the first supply node 410 may include a nominal resistor 434 and a nominal transistor 430 forming the first nominal path. A second nominal path coupled to the first supply node 410 may include a nominal resistor 448 and a nominal transistor 446 forming the second nominal path. The nominal paths may be coupled to the first supply node 410 via a first swing resistor 438 and a first swing capacitance 442.

The transmit line driver 400 further includes a plurality of nominal paths coupled to the second supply node 412. For example, a first nominal path coupled to the second supply node 412 may include a nominal transistor 432 and a nominal resistor 436. A second nominal path coupled to the second supply node 412 may include a nominal resistor 450 and a nominal transistor 452, as shown. The nominal paths may be coupled the second voltage supply node 412 via a second swing resistor 440 and a second swing capacitance 444.

The transmit line driver 400 also includes switched capacitive boost paths coupled to the first supply node 410. For example, a first switched capacitive boost path coupled to the first supply node 410 may include a first boost transistor 416, a second boost transistor 418, a boost resistor 420, and a boost capacitor 414. The first capacitive boost path may be coupled to the first supply node 410. The first switched capacitive boost path may be switched due to the first and second boost transistors 416 and 418, which may be implemented as switching elements as depicted in FIG. 4. The first switched capacitive boost path is further coupled to the output terminal 408.

A second switched capacitive boost path coupled to the first supply node 410 may include a first boost transistor 456, a second boost transistor 458, a boost resistor 460, and a boost capacitor 454. The second capacitive boost path may be coupled to the first supply node 410. The second switched capacitive boost path may be switched due to the first and second boost transistors 456 and 458, which may be implemented as switching elements, as shown. The second switched capacitive boost path is further coupled to the output terminal 406.

Switched capacitive boost paths coupled to the second supply node 412 may also be included. For example, a first switched capacitive boost path coupled to the second supply node 412 may include a boost resistor 422, a first boost transistor 424, and a second boost transistor 426 coupled to a boost capacitor 428. The boost capacitor 428 may be coupled to the second supply node 412. The first switched capacitive boost path may also be switchably controllable via the first and second boost transistors 424 and 426, and may be coupled to the output terminal 408.

As another example, a second switched capacitive boost path coupled to the second supply node 412 may include a first boost transistor 466, a second boost transistor 464, a boost resistor 462, and a boost capacitor 468. The second switched capacitive boost path may also be switchably controllable via the first and second boost transistors 466 and 464, and may be coupled to the output terminal 406.

It should be noted that each of the capacitive boost paths depicted in FIG. 4 may include a boost capacitor, a boost resistor, and a switch. Although FIG. 4 depicts various components such as capacitors, resistors, and transistors, various alternative embodiments may be implemented. By way of illustration, and not limitation, it will be appreciated that alternative components may be employed to realize capacitance, resistance, and switching functionalities.

Further, the transmit line driver 400 may be alternately viewed as containing two switched capacitive boost paths and two nominal paths. For example, a first alternate switched capacitive boost path may include the boost capacitor 414, the first boost transistor 416, the second boost transistor 418, the boost resistor 420, the boost resistor 422, the second boost transistor 424, the first boost transistor 426, and the boost capacitor 428. A first alternate nominal path may include the first swing resistor 438, the nominal transistor 430, the nominal resistor 434, the nominal resistor 436, the nominal transistor 432, and the second swing resistor 440. The first alternate switched capacitive boost path and the first alternate nominal path may be selectively coupled to the first supply voltage 480 or to the second supply voltage 490 responsive to input data applied to inputs 402, 404 (e.g. as described with reference to the first switched capacitive boost path 122 and the first nominal path 120 of FIG. 1). For example, the first alternate switched capacitive boost path and the first alternate nominal path may be coupled to the first supply voltage 480 responsive to a logical zero applied to inputs 402, 404. The first alternate switched capacitive boost path and the first alternate nominal path may be coupled to the second supply voltage 490 responsive to a logical one applied to inputs 402, 404. A second alternate switched capacitive boost path and a second nominal path of the transmit line driver 400 may similarly correspond to the second nominal path 124 and the second switched capacitive boost path 126 of FIG. 1.

In a particular embodiment, the transmit line driver 400 of FIG. 4 may be implemented as a voltage-mode differential signal driver. In particular, the transmit line driver 400 may be implemented as described with reference to the voltage-mode differential signal driver 100 of FIG. 1. In addition, the transmit line driver 400 may operate as described with reference to the method 200 of FIG. 2. Further, the transmit line driver 400 may realize timing features as described with reference to the timing diagrams 300 of FIG. 3.

During operation, a differential input signal may be received at the differential inputs 402, 404 of the transmit line driver 400 and applied to various circuitry to generate a differential output signal at the differential outputs 406, 408. To illustrate an operation of the transmit line driver 400, a particular example of a representative nominal path and a representative switched capacitive boost path will be described.

According to such an example operation, a voltage at the first supply node 410 may be applied to create a nominal current through the nominal path that includes the nominal resistor 434 and the nominal transistor 430. For example, since the nominal transistor 430 is coupled at its gate to the input 402, a low (e.g., logical 0) signal at the input 402 may turn on the nominal transistor 430. In this case, when the input 402 is low, a nominal current may flow from the first supply node 410 through the voltage swing resistor 438, the first nominal transistor 430, and the nominal resistor 434 to the output 408. Thus, when the input 402 is low, the nominal current may flow from the first supply node 410 through various elements of the first nominal path to the output 408 as shown.

When the first boost transistor 416 is on and the second boost transistor 418 is off, an open circuit may be presented at the second boost transistor 418. Further, the first boost transistor 416 being on and providing a low resistance connection from its drain to its source may charge the boost capacitor 414. Thus, the first capacitor 414 may be charged via the first supply node 410 by using the low resistance connection associated with the first boost transistor 416 in the "on" state.

In a second mode of operation, the boost transistor 418 may be on while the boost transistor 416 may be off. In this scenario, the boost capacitor 414 may be charged via the first supply voltage 480 and may be selectively enabled to discharge and provide a boost current through the first boost path via the first boost transistor 418 and the boost resistor 420 to the output 408. The charge of the boost capacitor 414 (which has been previously charged by the first supply node 410) may be discharged upon activation of the first boost transistor 418. A boost current may thus flow through the first boost path to supplement the first nominal current through the first nominal path, resulting in a combined signal applied to the output 408.

Each of the nominal paths and the switched capacitive boost paths depicted in FIG. 4 may perform as described with reference to the representative first nominal path and first switched capacitive boost path. Thus, four separate pairs of nominal paths and switched capacitive boost paths may be coupled and responsive to data transitions of input signals from four input elements, as shown in FIG. 4. The respective switched capacitive boost paths may be selectively activated and enabled to have a charge phase and a discharge phase, where the discharge phase may correspond to providing a boost current to equalize a signal to be transmitted at the outputs 406 and 408, respectively. Thus, the transmit line driver 400 may provide an illustrative embodiment of a circuit that can selectively add boost current using a capacitive boost path to provide equalization of a voltage-mode signal.

In particular embodiments, the transmit line driver 400 may be integrated into a first high speed integrated circuit configured to communicate with a second device, such as a second high speed interface circuit, over a communication channel. The communication channel may be a low-impedance or attenuated channel. The first and second high speed integrated circuits may be impedance matched to minimize reflections associated with data transmissions. For example, one or both high speed integrated circuits may incorporate terminations to minimize such reflections and reduce drawn current. In a particular illustrative embodiment, each high speed integrated circuit has an equivalent resistance of 100 ohms, yielding a differential 100 ohm system.

It will be appreciated that boost currents may be provided at low-to-high data transition times to pull up a voltage or current to be transmitted at the outputs 406, 408, thereby accelerating the data transitions. Various capacitors of the transmit line driver 400 may also be configured to act as current or voltage sinks, whereby the capacitors are configured to absorb power during high-to-low data transition times and thereby pull down a voltage or current to be transmitted at outputs 406, 408, thereby accelerating the data transitions. Further, use of the capacitors of transmit line driver 400 of FIG. 4 may consume less power than a resistive divider equalizer circuit. Accordingly, it will be appreciated that a device in accordance with the transmit line driver 400 of FIG. 4 is configured to provide selective equalization to a signal to be driven at an output, thus facilitating controlled power consumption.

It will further be appreciated that various alternate configurations of the transmit line driver 400 are possible, particularly in connection with various practical applications. For example, components and parameters of the transmit line driver 400 may be designed based on various criteria to adjust an equalization associated with operation of the transmit line driver 400. Various components may also be selectively configurable, e.g. via a computing device, to adjust properties of the transmit line driver 400 to facilitate transmission of data over various channels having differing characteristics.

In a particular embodiment, the first swing resistor 438 and the second swing resistor 440 may each be chosen to adjust a voltage swing associated with the transmit line driver 400. For example, the first swing resistor 438 and the second swing resistor 440 may have reduced resistances to facilitate an increased voltage swing of the transmit line driver 400. Alternatively, the first swing resistor 438 and the second swing resistor 440 may have increased resistances to facilitate a reduced voltage swing of the transmit line driver 400. The resistances of the first swing resistor 438 and the second swing resistor 440 may be selectively configurable, e.g. as potentiometers.

As another example, the equalization of the transmit line driver 400 may be configured by adjusting a capacitance of the boost capacitor 414, the boost capacitor 428, the boost capacitor 454, the boost capacitor 468, or any combination thereof. For example, a particular boost capacitor may be adjusted to configure a pull-up time associated with a high-to-low transition of a signal at the differential input 402, to configure a pull-down time associated with a low-to-high transition of a signal at the differential input 402, a high-to-low transition of a signal at the differential input 404, or to configure a pull-down time associated with a low-to-high transition of a signal at the differential input 404. In a particular embodiment, a capacitance of a capacitor (e.g. the boost capacitor 414, the boost capacitor 428, the boost capacitor 454, the boost capacitor 468, or any combination thereof) is configurable or programmable to alter an equalization associated with the transmit line driver 400. In a particular illustrative embodiment, a capacitor of the transmit line driver 400 is configurable or programmable to enable equalization over a plurality of different channels, e.g. channels with differing impedance characteristics.

As another example, the equalization of the transmit line driver 400 may be configured by adjusting the resistances of the boost resistor 420, the boost resistor 422, the boost resistor 460, the boost resistor 462, the nominal resistor 434, the nominal resistor 436, the nominal resistor 448, the nominal resistor 450, or any combination thereof. In a particular illustrative embodiment, a ratio between a boost resistor and a corresponding nominal resistor can be adjusted, e.g. to provide selective equalization in response to bit transitions of data to be transmitted. For example, a ratio between values of the boost resistor 420 and the nominal resistor 434 can be increased to provide a greater ratio of nominal current to boost current or decreased to provide a reduced ratio of nominal current to boost current.

The transmit line driver shown in FIG. 4 and other embodiments in accordance with the present disclosure may be designed using various electronic design automation (EDA) tools as part of a circuit design process. Such design tools are executable on a computer, such as a personal computer having processor and a memory. Thus, computer programs may be executable on a personal computer to run applications such as EDA design tools that may be used to design circuits, such as the transmit line driver shown in FIG. 4. For example, the circuit depicted in FIG. 4 may be fabricated using existing process technologies, including complementary metal-oxide semiconductor (CMOS) techniques, and may be fabricated without a voltage regulator device.

In a particular illustrative embodiment, a non-transitory, tangible computer readable storage medium storing a computer readable data file (e.g., readable by a computer program) may be deployed. The computer readable data file may include design information corresponding to a semiconductor device. A semiconductor device may be a voltage-mode differential signal driver such as the driver 400 of FIG. 4 or the driver 100 of FIG. 1.

In a particular illustrative embodiment, the data file includes design information corresponding to a voltage-mode differential signal driver that includes a first nominal path coupling a first supply to a first output terminal and a first switched capacitive boost path coupled to the first supply and to the first output terminal. The first switched capacitive boost path is selectively enabled to provide a boost current to be added to current from the nominal path to generate a signal to be transmitted at the output terminal.

In a particular implementation, the semiconductor device further includes instructions or design information for a swing resistance to be configured to adjust a voltage swing associated with a signal to be transmitted. For example, the swing resistance may be the first swing resistor 440 or the second swing resistor 438. Alternatively, or in addition, a swing capacitance may be used to also affect the voltage swing of the transmitted output signal. For example, in FIG. 4, the first swing capacitor 444 or the second swing capacitor 442 may be applied or alternatively adjusted in order to customize or otherwise design appropriate voltage in a particular application.

It should also be noted that the design information may provide for each of the capacitive boost paths to be controlled by equalization circuitry, such that the capacitive boost paths selectively provide boost current during a data transition of an input signal received at the voltage-mode differential driver. For example, various transistors and interconnecting circuit elements such as wires and other interconnects may be provided and designed in a manner such that one or more of the switched capacitive boost paths provide boost current at a time corresponding to a transition of an input signal of the differential input as described herein. In addition, while one of the capacitive boost paths is providing boost, one or more of the other capacitive boost paths may be in a charging or recharging state, rather than providing boost current. Thus, alternative modes of charging and providing boost current for different boost paths may be controlled by the equalization circuitry.

The computer readable data file may be implemented in a fabrication or manufacturing process, for example to manufacture a voltage-mode differential driver according to embodiments of the present disclosure. In a particular illustrative embodiment, the data file is uploaded at a personal computer, and various information and instructions to implement a voltage-mode differential driver are deployed. For example, a user may deploy the design file on the personal computer via a graphical user interface. In another particular embodiment, a library file is provided that includes the data file. The library file may include a library of semiconductor devices, including the system 100 of FIG. 1 or the circuit of FIG. 4, that the user may deploy to realize the voltage-mode differential driver via the fabrication process, e.g. by incorporating the method 200 of FIG. 2 or features of the timing diagram 300 of FIG. 3.

A mask for photolithography may be generated according to a Graphic Database System (GDSII) file containing information corresponding to a voltage-mode differential driver. For example, a voltage-mode differential driver may be generated using the GDSII file by forming one or more wafers. The wafers may be thereafter separated into semiconductor dies. The die may include any or all of a device incorporating the system 100 of FIG. 1, a device that operates according to the method of FIG. 2, a device that operates according to the timing diagram of FIG. 3, and a device that includes the circuit of FIG. 4.

As part of or in addition to the fabrication procedure, the die may be integrated into an electronics device. The electronics device may be a music player, a video player, an entertainment unit, a navigation device, a global positioning system (GPS), a cellular phone, a plain old telephone system (POTS), a communications device, a personal digital assistant (PDA), a fixed location data unit, a personal computer (e.g. a laptop), or any combination thereof.

The methods and algorithms described herein may be implemented in hardware, in a computer-readable medium storing instructions to be executed by a processor, or via a combination of the two. Those of skill in the art will recognize that the computer readable medium may comprise a variety of tangible, non-transient articles of manufacture, including flash memory, random access memory (RAM), read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium capable of storing instructions to be executed by a processor. The computer-readable medium may be coupled to the processor, enabling the processor to read information from, and write information to, the computer-readable medium. Alternatively, the computer-readable medium may include embedded hardware. An application-specific integrated circuit (ASIC) may include both the processor and the computer-readable medium. The ASIC may reside in a personal computer, a user terminal, a design computer, and the like. In the alternative, the processor and the computer-readable medium may be distributed components in a network or other distributed system or device.

The components, configurations, and algorithms described in connection with embodiments of the present disclosure may be implemented in hardware, software, firmware, or a combination thereof. Those skilled in the art will recognize that numerous such implementations are possible without departing from the functionalities of the embodiments described herein. Such implementations should not be construed as departing from the scope of the components, configurations, and algorithms described herein. Thus, the embodiments contemplated herein should not be limited to the examples shown, but should be accorded the widest scope commensurate with the following claims.

What is claimed is:

1. A voltage-mode differential signal driver comprising:
   a first nominal path selectively coupling, responsive to input data, a first supply or a second supply to a first output terminal; and
   a first capacitive boost path selectively coupling, responsive to the input data, the first supply or the second supply to the first output terminal,
      wherein the first capacitive boost path is selectively enabled to provide a boost current to be added to a current from the first nominal path resulting in an output current to be provided to the first output terminal, wherein the first capacitive boost path further includes a capacitor and a resistor, wherein the resistor and the capacitor form a resistor-capacitor (RC) element, and wherein a time constant associated with the RC element is based on a loss property of a load at the first output terminal.

2. The voltage-mode differential signal driver of claim 1, wherein the first capacitive boost path comprises at least a first switching element configured to selectively enable the boost current to flow between the first supply and the first output terminal.

3. The voltage-mode differential signal driver of claim 2, further comprising a second nominal path to drive a second output terminal by selectively coupling the second output terminal to the first supply or to the second supply responsive to the input data.

4. The voltage-mode differential signal driver of claim 3, further comprising a second capacitive boost path, wherein the second capacitive boost path comprises at least a second switching element configured to selectively enable second boost current to flow between the first supply or the second supply and the second output terminal via the second capacitive boost path.

5. The voltage-mode differential signal driver of claim 2, further comprising equalization circuitry configured to selectively adjust a power of a signal to be transmitted at the first output terminal.

6. The voltage-mode differential signal driver of claim 1, wherein a capacitance of the capacitor is programmable to enable equalization over a plurality of different channels.

7. The voltage-mode differential signal driver of claim 1, further comprising a swing resistance and a swing capacitor coupled to the first supply and configured to alter a voltage swing of a signal transmitted via the first output terminal.

8. The voltage-mode differential signal driver of claim 3, wherein the first output terminal and the second output terminal comprise a differential output configured to communicate with a second device via a common electrical interface (CEI).

9. A method, comprising:
   charging a first capacitor of a capacitive boost path via a first voltage supply; and
   transmitting a signal at an output of a voltage-mode differential driver based on a nominal current provided by a nominal path coupled to the first voltage supply and based on a boost current from the capacitive boost path, wherein the boost current is selectively added to the nominal current to equalize the signal, and wherein the capacitive boost path includes a boost capacitor, a boost resistor, and a switching element.

10. The method of claim 9, wherein the capacitive boost path selectively adds the boost current to the nominal current in response to a bit transition of an input signal received at an input terminal of the voltage-mode differential driver.

11. The method of claim 10, wherein a first capacitor in the capacitive boost path is configured to equalize the signal by storing charge and selectively discharging to add the boost current to the nominal current.

12. An apparatus comprising:
   a transmit line driver including:
      a differential input, a differential output, a first supply node, a second supply node, a first plurality of nominal paths coupled to the first supply node, a second plurality of nominal paths coupled to the second supply node, a first plurality of capacitive boost paths coupled to the first supply node, and a second plurality of capacitive boost paths coupled to the second supply node, wherein at least one of the first plurality of nominal paths includes a resistor and a transistor.

13. The apparatus of claim 12, wherein the transmit line driver is integrated into a first high-speed interface circuit configured to communicate with a second high-speed interface circuit over a channel.

14. The apparatus of claim 12, wherein at least one of the first plurality of capacitive boost paths includes a boost capacitor, a boost resistor, and a switching element.

15. A non-transitory computer-readable medium storing a computer-readable data file, wherein the computer-readable data file comprises design information corresponding to a semiconductor device, and wherein the semiconductor device comprises a voltage-mode differential signal driver including a first nominal path selectively coupling a first supply or a second supply to a first output terminal responsive to input data and a first capacitive boost path selectively coupling the first supply or the second supply to the first output terminal responsive to the input data, wherein the first capacitive boost path is selectively enabled to provide a boost current to be added to current from the nominal path to generate a signal to be transmitted at the output terminal, wherein the semiconductor device further comprises a swing resistance that is configurable to adjust a voltage swing associated with the signal to be transmitted.

16. The non-transitory computer-readable medium of claim 15, wherein the first capacitive boost path is controlled by equalization circuitry such that the capacitive boost path selectively provides the boost current during data transitions of an input signal received at the voltage mode differential driver.

17. The method of claim 9, wherein the nominal path further includes a resistor and a transistor.

18. The method of claim 9, wherein the boost resistor and the boost capacitor form a resistor-capacitor (RC) element.

19. The method of claim 9, wherein a capacitance of the boost capacitor is programmable to enable equalization over a plurality of different channels.

20. The method of claim 9, wherein the capacitive boost path includes at least a first switching element configures to selectively enable the boost current to flow between the first voltage supply and a first output terminal.

21. A voltage-mode differential signal driver comprising:
a first nominal path selectively coupling, responsive to input data, a first supply or a second supply to a first output terminal; and
a first capacitive boost path selectively coupling, responsive to the input data, the first supply or the second supply to the first output terminal,
wherein the first capacitive boost path is selectively enabled to provide a boost current to be added to a current from the first nominal path resulting in an output current to be provided to the first output terminal, wherein the first output terminal is coupleable to a printed circuit board trace via a package connection.

* * * * *